US007030690B2

(12) United States Patent
Dvorak

(10) Patent No.: US 7,030,690 B2
(45) Date of Patent: Apr. 18, 2006

(54) OPERATIONAL AMPLIFIER WITH SELECTABLE PERFORMANCE CHARACTERISTICS

(75) Inventor: Mark D. Dvorak, Waseca, MN (US)

(73) Assignee: Honeywell International, Inc., Minneapolis, MN (US)

( * ) Notice: Subject to any disclaimer, the term of this patent is extended or adjusted under 35 U.S.C. 154(b) by 82 days.

(21) Appl. No.: 10/777,323

(22) Filed: Feb. 12, 2004

(65) Prior Publication Data
US 2005/0179488 A1 Aug. 18, 2005

(51) Int. Cl.
*H03F 1/14* (2006.01)

(52) U.S. Cl. .............................. 330/51; 330/9; 330/122; 330/255; 330/310; 330/311

(58) Field of Classification Search .................. 330/51, 330/55, 118, 133, 252–255, 310
See application file for complete search history.

(56) References Cited

U.S. PATENT DOCUMENTS

| 5,059,921 | A | * | 10/1991 | Vyne et al. .................. 330/261 |
| 5,661,434 | A | * | 8/1997 | Brozovich et al. ............ 330/51 |
| 6,262,627 | B1 | * | 7/2001 | Ghiozzi et al. ............... 330/51 |
| 6,535,061 | B1 | * | 3/2003 | Darmawaskita et al. .... 330/254 |
| 6,559,716 | B1 | | 5/2003 | Sauerbrey et al. |
| 2002/0067206 | A1 | * | 6/2002 | Drmawaskita et al. ...... 330/254 |
| 2003/0132801 | A1 | * | 7/2003 | Grebennikov et al. ...... 330/133 |
| 2003/0222709 | A1 | * | 12/2003 | Kim ........................... 330/51 |
| 2004/0008084 | A1 | | 1/2004 | Dvorak |

OTHER PUBLICATIONS

IEEE 0018-9200/82/1200-0969 1982, "MOS Operational Amplifier Design—A Tutorial Overview", IEEE Journal of Solid-State Circuits, vol. SC-17, No. 6, Dec. 1982.
IEEE 0018-9200/94 1994, "Switched-Opamp: An Approach to Realize Full CMOS Switched-Capacitor Circuits at Very Low Power Supply Voltages", IEEE Journal of Solid-State Circuits, vol. 29, No. 8, Aug. 1994.

* cited by examiner

*Primary Examiner*—Peguy Jeanpierre
*Assistant Examiner*—Khai Nguyen
(74) *Attorney, Agent, or Firm*—McDonnell Boehnen Hulbert & Berghoff LLP

(57) ABSTRACT

An operational amplifier with selectable performance characteristics is provided. The operational amplifier provides a sleep mode (e.g., fully disabled) in addition to providing a number of different levels of awake operation (e.g., different performance characteristics). As such, the op-amp can allow a system to use only the power needed to obtain a required level of performance at any point in time. For example, the op-amp may be operated at a minimum power mode, an awake at mid-level power mode, or an awake at maximum power mode.

28 Claims, 5 Drawing Sheets

OPERATIONAL AMPLIFIER WITH SELECTABLE PERFORMANCE CHARACTERISTICS

FIELD OF INVENTION

The present invention relates to analog amplifiers and, more particularly, to operational amplifiers with selectable performance characteristics.

BACKGROUND

Operational amplifiers (or "op-amps") are high-gain DC coupled amplifiers with two inputs and a single output, and have been used as comparators, audio amplifiers, filters, etc. An operational amplifier is basically a differential amplifier that amplifies the difference between the two inputs. One input has a positive effect on the output signal of the amplifier, and the other input has a negative effect on the output signal. Both inputs act on the output signal simultaneously, and the output signal is the sum of both inputs. Accordingly, if both inputs are equal, then the output signal is ideally zero.

An electronic system incorporating an operational amplifier is frequently required to operate with a large dynamic range. Typically, this requirement means that the electronic system be able to function properly with signal levels ranging from a small signal level to a large signal level. In order for the electronic system to operate well when the signal level is small, the electronic system should introduce little electronic noise. On the other hand, in order to handle large signals, the electronic system should behave in a linear manner so as not to introduce any distortion into its output signal.

Increasingly, the ability to conserve power is being recognized as an important factor in electronic systems. Systems may use operational amplifiers that are designed to support power management by providing two modes of operation, i.e., fully disabled or fully enabled, such as switched capacitor-operational amplifiers. However, as systems become more sophisticated, a more optimized power management capability is desirable, such as through the use of multi-mode operational amplifiers.

SUMMARY

In an exemplary embodiment, a multi-mode operational amplifier is provided. The operational amplifier includes an amplifier and mode selection circuitry. The amplifier is arranged to amplify a difference between a first input and a second input so as to provide a differential output. The mode selection circuitry is coupled to the amplifier and arranged to provide a control signal to the differential output. The control signal operates to provide a number of different operational modes for the amplifier.

In another respect, the exemplary embodiment may take the form of a multi-mode operational amplifier that includes a differential amplifier, a selectable input stage circuit and a selectable output stage circuit. The differential amplifier is coupled to a pair of input terminals and is arranged to provide an output signal on a differential amplifier output. The selectable input stage circuit is also coupled to the pair of input terminals and arranged to provide a second output signal on a second differential amplifier output and possibly to the differential amplifier output. The selectable output stage circuit is coupled to the differential amplifier output and the second differential amplifier output. Based on whether one or both of the selectable input stage circuit and the selectable output stage circuit are enabled, the selectable input stage circuit or the selectable output stage circuit provides a control signal to the differential amplifier output that operates to control a performance characteristic of the differential amplifier.

In still another respect, the exemplary embodiment may take the form of an operational amplifier that includes a bias circuit, an input stage, an output stage, a parallel input stage, and a parallel output stage. The bias circuit is arranged to provide a reference to the output stage. The input stage is coupled to a pair of input terminals and includes a differential amplifier arranged to create a difference signal between signals on the pair of input terminals. The output stage is coupled to the reference, to the difference signal, and to a differential amplifier output and is arranged to provide an output signal on a differential amplifier output. The parallel input stage is coupled to the reference and is arranged to provide a second output signal on a second differential amplifier output. The parallel output stage is coupled to the second differential amplifier output and is arranged to output a control signal to the differential amplifier output.

These as well as other features and advantages will become apparent to those of ordinary skill in the art by reading the following detailed description, with appropriate reference to the accompanying drawings.

BRIEF DESCRIPTION OF FIGURES

Exemplary embodiments are described with reference to the following drawings, in which.

DETAILED DESCRIPTION OF EXEMPLARY EMBODIMENTS

In an exemplary embodiment, a multi-mode operational amplifier (op-amp) is provided.

The op-amp may provide a "sleep" mode (e.g., fully disabled) in addition to providing a number of different levels of "awake" operation (e.g., different performance characteristics). As such, the op-amp can allow a system to use only the power needed to obtain a required level of performance at any point in time. For example, the op-amp may be operated at a minimum power mode, an awake at mid-level power mode, or an awake at maximum power mode. The op-amp may be operated at any number of operational modes (in addition to typical awake or "on" and sleep or "off" modes) depending on available input pins to receive inputs.

Figure 1:
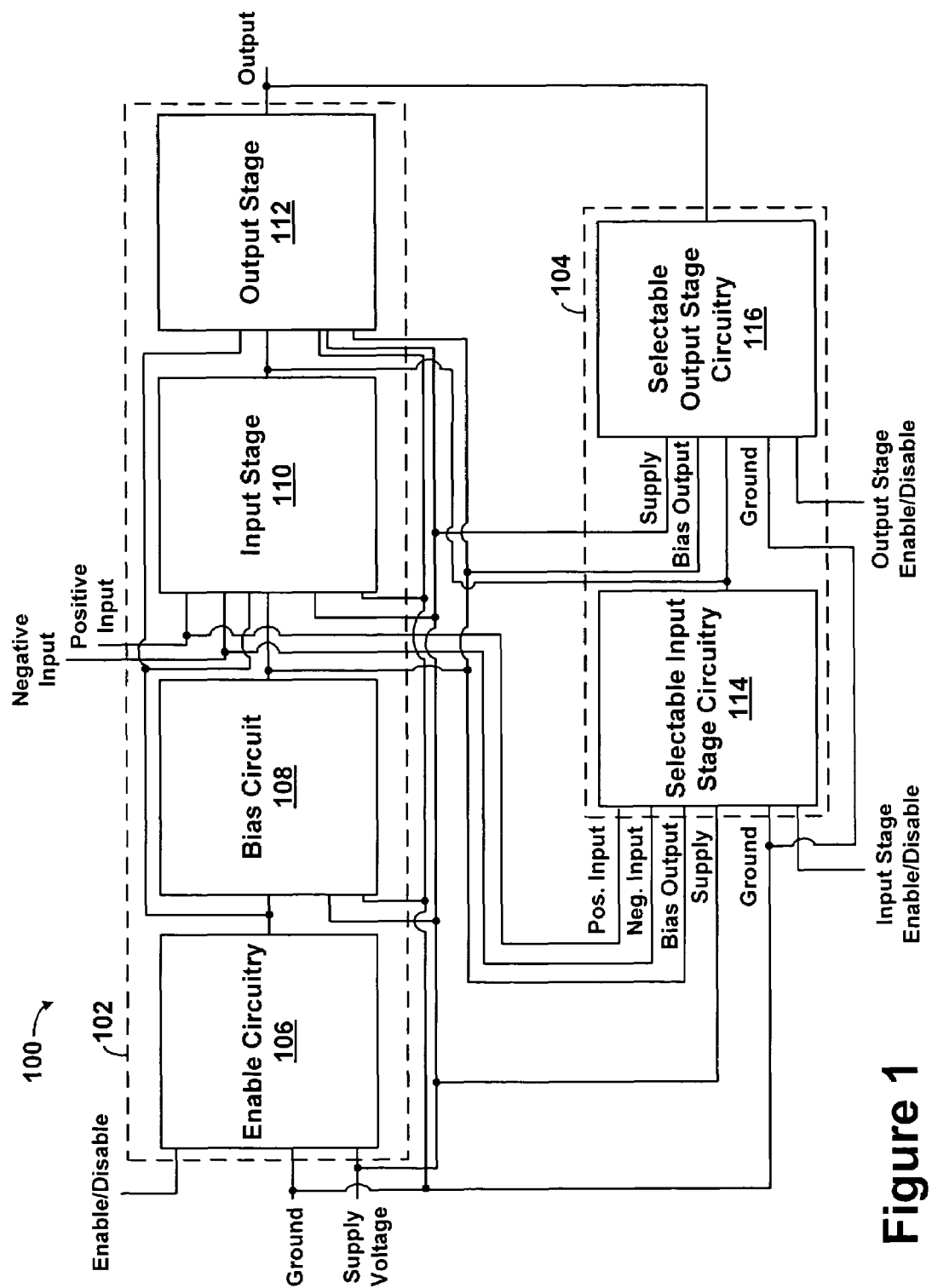
FIG. 1 is a block diagram illustrating one embodiment of an operational amplifier with selectable performance characteristics.

Referring now to the figures, and more particularly to FIG. 1, a block diagram illustrating one embodiment of an operational amplifier (op-amp) 100 with selectable performance characteristics is illustrated. It should be understood that the op-amp 100 illustrated in FIG. 1 and other arrangements described herein are set forth for purposes of example only, and other arrangements and elements can be used instead and some elements may be omitted altogether, depending, for example, on manufacturing and/or consumer preferences.

By way of example, the op-amp 100 includes a differential amplifier 102 and mode selection circuitry 104. The differential amplifier 102 includes enable circuitry 106, a bias circuit 108, an input stage 110 and an output stage 112. Similarly, the mode selection circuitry 104 includes selectable input stage circuitry 114 and selectable output stage circuitry 116. Each element of the op-amp 100 is connected to a supply voltage and a ground reference to provide power to the op-amp 100.

Generally, the differential amplifier 102 may operate as a standard two-stage operational amplifier. The differential amplifier 102 is connected to a positive input and a negative input (or positive and negative voltage supplies), establishing ground as about halfway between the two inputs. Raising the negative input value lowers a voltage at the output of the differential amplifier 102 and raising the positive input value raises the output of the differential amplifier 102. For more information on the operation of an operational amplifier, the reader is referred to *Analysis and Design of Analog Integrated Circuits*, Fourth Edition, by Paul Gray, Paul Hurst, Stephen Lewis, and Robert Meyer, published by John Wiley and Sons (2001), the contents of which are fully incorporated herein by reference, as if fully set forth in this description.

Within the differential amplifier 102, the enable circuitry 106 performs as a switch to either fully enable or fully disable (e.g., turn "on" or turn "off") the differential amplifier 102. Thus, the enable circuitry 106 includes an enable/disable input. The enable circuitry 106 outputs to the bias circuit 108, input stage 110 and output stage 112. The bias circuit 108 creates a reference voltage to be output to the input stage 110. In turn, using the reference voltage, the input stage 110 forms a difference signal between signals on a negative input and a positive input terminal. The input stage 110 supplies this difference signal to the output stage 112. The output stage 112 then amplifies this difference signal to provide an amplified signal on an output terminal.

The mode selection circuitry 104 operates to control operational modes of the op-amp 100, and thus to control performance characteristics of the differential amplifier 102. For example, outputs from the selectable input stage circuitry 114 and the selectable output stage circuitry 116 can vary a supply current output from the differential amplifier 102, a unity gain bandwidth (in MHz) of the op-amp 100, an input-referred noise value (in nV/rt(Hz)) of the op-amp 100, or a linearity of the op-amp 100, for example. These performance characteristics vary depending on whether one, both, or neither of the selectable input stage circuitry 114 and selectable output stage circuitry 116 are enabled. Thus, the op-amp 100 has selectable performance characteristics.

As shown in FIG. 1, the selectable input stage circuitry 114 receives the positive and negative input values to form a difference signal between these signals. The selectable input stage circuitry 114 also includes an enable/disable input, so that the circuitry 114 can be turned on and off to vary the performance characteristics. The selectable input stage circuitry 114 outputs to the output stage 112 of differential amplifier 102 and to the selectable output stage circuitry 116. The selectable output stage circuitry 116 receives and amplifies this difference signal to provide a control signal to the output terminal of the differential amplifier 102. Similar to the selectable input stage circuitry 114, the selectable output stage circuitry 116 includes an enable/disable input to provide further controls to modify performance characteristics of the op-amp 100.

Figure 2:
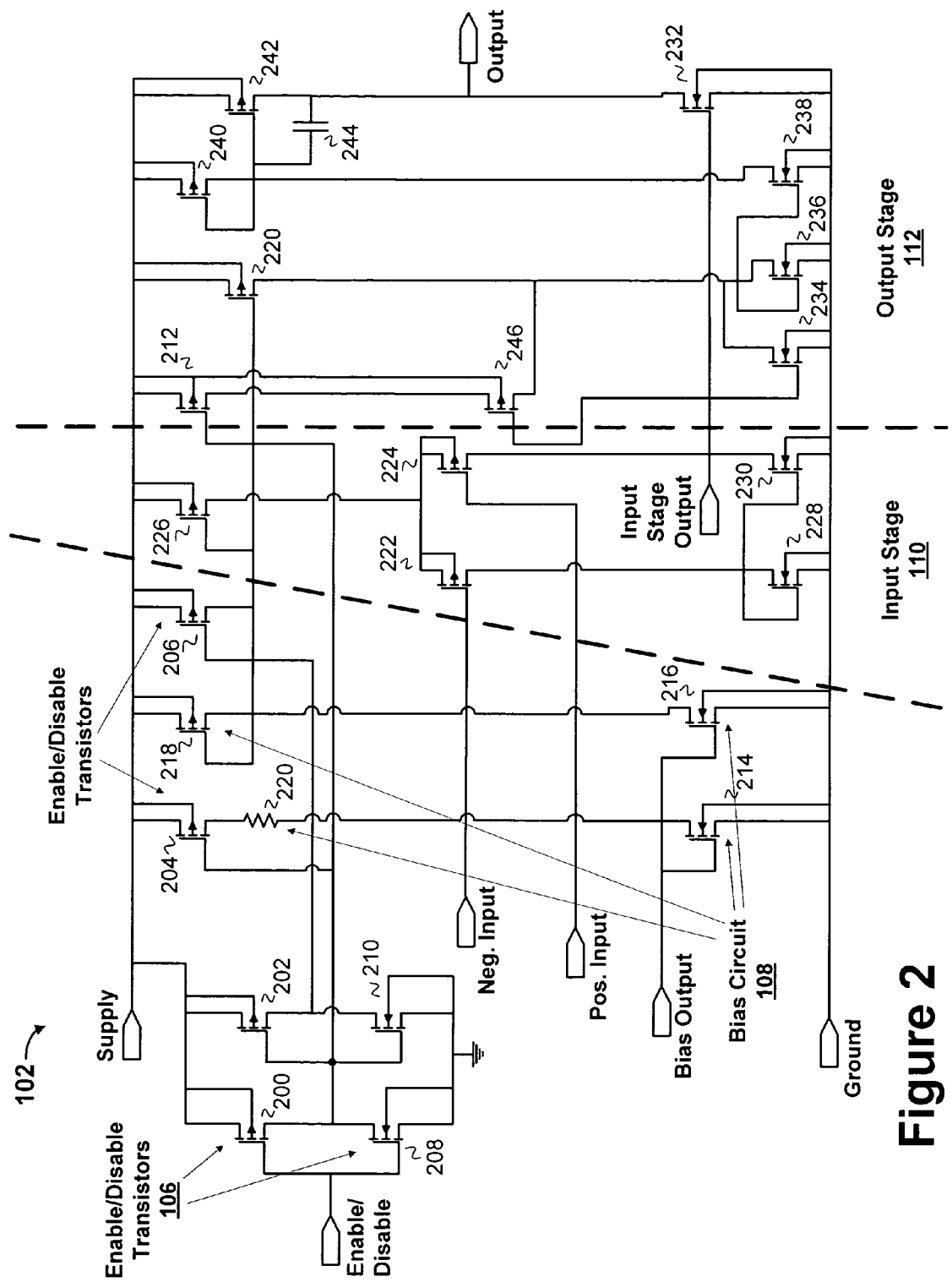
FIG. 2 is a schematic diagram illustrating one embodiment of a portion of the operational amplifier of FIG. 1.

FIG. 2 is a schematic diagram illustrating one embodiment of a portion of the operational amplifier of FIG. 1. The portion illustration in FIG. 2 is the differential amplifier 102. Thus, the schematic includes the enable circuit 106, the bias circuit 108, the input stage 110 and the output stage 112.

FIG. 2 illustrates the enable circuit 106 to include four p-channel transistors 200, 202, 204, and 206 and two n-channel transistors 208 and 210. The gates of the p-channel transistor 200 and the n-channel transistor 208 are coupled to the enable/disable input. The source and base regions of the n-channel transistors 208 and 210 are coupled together, and the drain regions of the p-channel transistor 200 and the n-channel transistor 208 are coupled together. Similarly, the drain regions of the p-channel transistor 200 and the n-channel transistor 208 are coupled together. The source and base regions of the p-channel transistors 200, 202, 204 and 206 are connected to the supply input. The drain regions of the p-channel transistor 202 and the n-channel transistor 210 are connected to the gate region of the p-channel transistor 206. In addition, the drain regions of the p-channel transistor 200 and the n-channel transistor 208 are connected to the gate region of an output stage transistor 212.

The enable/disable input is a voltage signal ranging from 0 to the supply voltage. The enable/disable transistors are essentially used as switches. For example, when the gate of the p-channel transistor 204 is driven to the supply voltage, the transistor is turned off, which prevents current from flowing through the bias circuit 108. Similarly, when the gate of the p-channel transistor 206 is taken to the supply voltage the transistor is turned off (the switch is open). This allows the node which includes the gates of p-channel transistors 218, 226, and 220 to be biased at some voltage below the supply voltage so that the normal operational current can flow into the input stage 110 and output stage 112. Thus a supply voltage signal to the transistors 204 and 206 enables the differential amplifier 102.

When the gate of the p-channel transistor 204 is pulled to ground, the switch is closed and the bias current is allowed to flow. Similarly, when the gate of the p-channel transistor 206 is taken to ground the switch is closed, which pulls the gates of the p-channel transistors 218, 226, and 220 to the supply voltage. These three transistors then have about a zero gate-to-source voltage, so that the transistors do not conduct current. Thus a 0 Volt signal to the gate of p-channel transistor 206 disables the differential amplifier 102.

The bias circuit 108 of the differential amplifier 102 includes two n-channel transistors 214 and 216, a p-channel transistor 218 and a resistor 220. The source and base regions of the n-channel transistors 214 and 216 are connected to ground. And the gate regions of the n-channel transistors 214 and 216 are connected to a bias input. The bias input is a voltage signal that is either 0 Volts or the supply voltage. The drain region of the n-channel transistor 214 is connected through the resistor 220 to the drain region of the enable p-channel transistor 204. The drain region of the n-channel transistor 216 is connected to the drain region of the p-channel transistor 218. The source and base regions of the p-channel transistor 218 are connected to the supply input, and the gate region of the p-channel transistor 218 is connected to a gate region of an output stage p-channel transistor 220.

The bias circuit 108 creates a reference signal through the resistor 220 and the diode-connected transistor 214. This voltage is used by the n-channel transistor 216 to create a current that is then available to establish the currents in the input stage 110 and the output stage 12 by current mirrors. The reference voltage is also used by the input stage 114 and output stage 116.

The input stage 110 includes three p-channel transistors 222, 224, and 226 and two n-channel transistors 228 and 230. The gate region of the p-channel transistor 226 is coupled to an output from the bias circuit 108 (e.g., the gate region of the p-channel transistor 218), and the drain region of the p-channel transistor 226 is coupled to the source and base regions of the p-channel transistors 222 and 224. The gate region of the p-channel transistor 222 is coupled to the negative input of the op-amp 100, and the gate region of the p-channel transistor 224 is coupled to the positive input of the op-amp 100. The gate and drain regions of the n-channel transistor 228 are coupled together, to the drain region of the p-channel transistor 222, and to the gate region of the n-channel transistor 230. The drain region of the p-channel transistor 224 is coupled to the drain region of the n-channel transistor 230. The source and base regions of the n-channel transistors 228 and 230 are connected to ground. The two p-channel transistors 222 and 224 form a differential amplifier having an amplifier output connected to an output stage n-channel transistor 232. Accordingly, the two p-channel transistors 222 and 224 form a difference between the signals on the negative and positive inputs and supplies this difference as a signal to the amplifier output.

The output stage 112 includes five p-channel transistors 212, 220, 240, 242 and 246, a capacitor 244 and four n-channel transistors 234, 236, 238 and 232. The drain and base regions of the p-channel transistors 212 are connected to the drain and base regions of the p-channel transistor 246. The base regions of the p-channel transistors 212 and 246 are connected to the supply input, in addition to the source region of the p-channel transistor 212. The gate region of the p-channel transistor 246 is coupled to the gate region of the n-channel transistor 234. The drain region of the p-channel transistor 246 is coupled to the drain regions of the n-channel transistors 234 and 236, and the drain regions of the p-channel transistor 220. The gate and source regions of the four n-channel transistors 234, 236, 238 and 232 are each connected to ground. The gate regions of the n-channel transistors 236 and 238 are coupled together, and the drain region of the n-channel transistor 238 is connected to the drain and gate regions of the p-channel transistor 240. The source and base regions of the p-channel transistors 220, 240 and 242 are all connected to the supply input, and the gate regions of the p-channel transistors 240 and 242 are connected together and through the capacitor 244 to the output. The n-channel transistor 232 receives an output from the input stage 114 into the gate region and is connected to the output through the drain region.

A function of all of the transistors 246, 234, 236, 238, 240, 220, 242 in the output stage 112 is to create a push-pull type of output amplifier, so that n-channel transistor 232 and p-channel transistor 242 either push a voltage on the output node down or pull a voltage on the output node up. For example, n-channel transistor 232 works to push the voltage on the output down and p-channel transistor 242 works to pull the voltage on the output node up.

Figure 3:
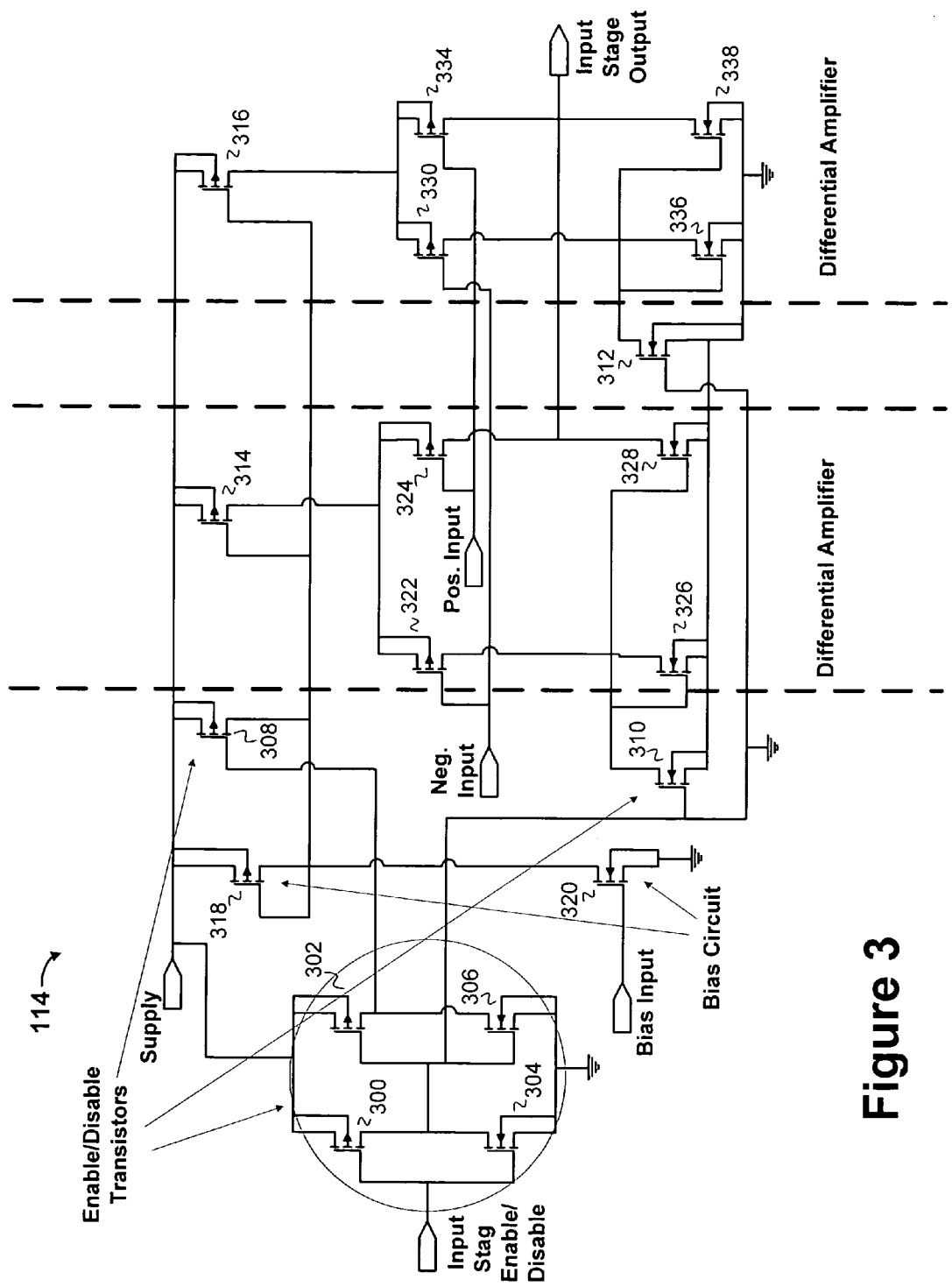
FIG. 3 is a schematic diagram illustrating one embodiment of another portion of the operational amplifier of FIG. 1.

FIG. 3 is a schematic diagram illustrating one embodiment of another portion of the operational amplifier of FIG. 1. The portion illustrated in FIG. 3 is the selectable input stage circuit 114. The input stage 114 includes disable circuitry comprising three p-channel transistors 300, 302, and 308, and three n-channel transistors 304, 306 and 310. The gate regions of the p-channel transistor 300 and the n-channel transistor 304 are connected to the input stage enable/disable input, which is either 0 Volts or the supply voltage. The drain regions of the p-channel transistor 300 and the n-channel transistors 304 and 206 are coupled together, and the source and base regions of the n-channel transistor 304 are coupled together. The source and base regions of the p-channel transistors 300 are coupled to the source and base regions of the p-channel transistor 302, which in turn are coupled to the supply input. The gate regions of the p-channel transistor 302 and the n-channel transistor 306 are coupled to the drain regions of the p-channel transistor 300 and the n-channel transistor 304. The gate regions of the p-channel transistor 302 and the n-channel transistor 306 are coupled to the gate region of the n-channel transistor 310 and to the gate region of n-channel transistor 312. The drain regions of the p-channel transistor 302 and the n-channel transistor 306 are coupled to the gate region of the p-channel transistor 308. The source and base regions of the p-channel transistor 308 are coupled to the supply input, and the drain region of the p-channel transistor 308 is coupled to the gate regions of p-channel transistors 314 and 316. The disable circuit either allows the input circuit 114 to operate or disables the input circuit 114 depending on the value of the enable/disable input (in a similar fashion as above in FIG. 2 with disable circuit 106).

The selectable input stage circuit 114 also includes a bias circuit comprising an n-channel transistor 320 and a p-channel transistor 318. The source and base regions of the n-channel transistor 320 are coupled together and the gate region is connected to a bias input. The drain region of the n-channel transistor 320 is connected to the drain region of the p-channel transistor 318. The source and base regions of the p-channel transistor 318 are connected to the supply input, and the gate region of the p-channel transistor 318 is connected to the gate region of the p-channel transistor 316. The bias output voltage created in FIG. 2 (i.e., output from transistors 214 and 216) is coupled to the gate of transistor 320 and is used to bias the input circuit 114 in the same manner as in the circuit of FIG. 2.

The selectable input stage circuit 114 also includes two differential amplifiers. One differential amplifier includes three p-channel transistors 314, 322 and 324, and two n-channel transistors 326 and 328. The source and base regions of the p-channel transistors 322 and 324 are coupled together and to the drain region of the p-channel transistor 314. The drain regions of the p-channel transistors 322 and 324 are coupled to the drain regions of the n-channel transistors 326 and 328, respectively. The gate region of the p-channel transistor 322 is coupled to the negative input, and the gate region of the p-channel transistor 324 is coupled to the positive input. The gate regions of the n-channel transistors 326 and 328 are coupled to the drain region of the n-channel transistor 310. The source and base regions of the n-channel transistors 326 and 328 are coupled to ground. The drain regions of the p-channel transistor 324 and the n-channel transistor 328 are then output as the input stage output. The other differential amplifier is substantially the same, including three p-channel transistors 316, 330 and 334 and two n-channel transistors 336 and 338 connected in a similar configuration.

The input stage 114 operates in a similar fashion as input stage 110. In particular, the input stage 114 creates a difference signal between the positive and negative inputs and supplies this difference signal to the output stage 112 and the output stage 116.

Figure 4:
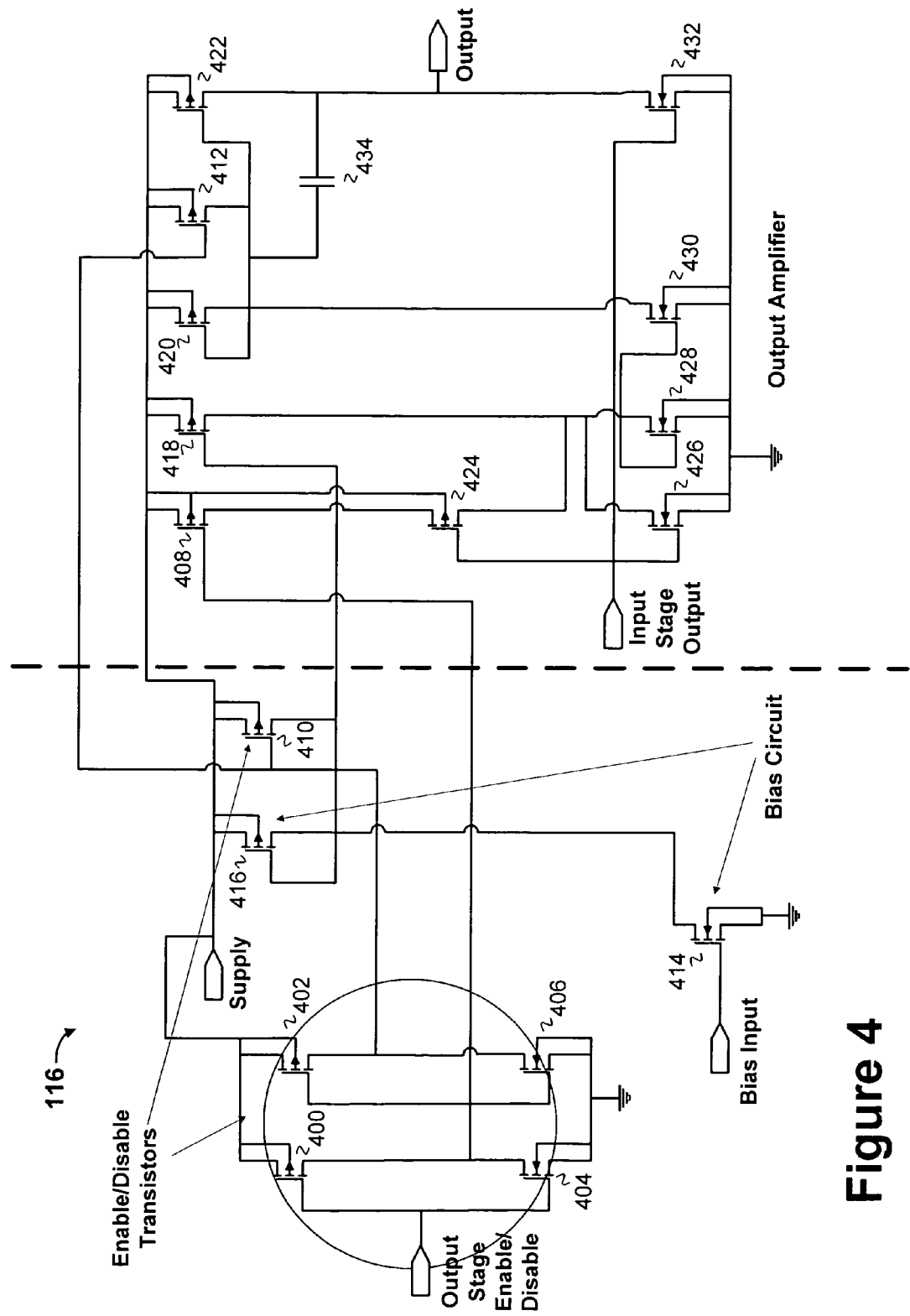
FIG. 4 is a schematic diagram illustrating one embodiment of yet another portion of the operational amplifier of FIG. 1.

FIG. 4 is a schematic diagram illustrating one embodiment of yet another portion of the operational amplifier of FIG. 1. FIG. 4 illustrates the selectable output stage circuit 116. The output stage circuit 116 includes disable circuitry, similar to the input stage 114. The disable circuitry comprises two p-channel transistors 400 and 402 and two n-channel transistors 404 and 406. The source and base regions of the p-channel transistors 400 and 402 are coupled together and coupled to each other. The gate regions of the p-channel transistor 400 and the n-channel transistor 404 are coupled together, and they are also coupled to the enable/disable input. The drain regions of the p-channel transistor 400 and the n-channel transistor 404 are coupled together as are the drain regions of the p-channel transistor 402 and the n-channel transistor 406, which are also coupled to a gate region of p-channel transistor 410 and an output p-channel transistor 412. Further, the gate regions of the p-channel transistor 402 and the n-channel transistor 406 are coupled together and to a gate region of an output p-channel transistor 408. Similar to the disable circuitry of the input stage 114, the disable circuit of the output stage 116 controls whether the output stage is turned on or turned off depending on the value of the output stage enable/disable input.

The output stage circuit 116 further includes bias circuitry comprising an n-channel transistor 414, with its gate region connected to the bias input, and a p-channel transistor 416. The source and base regions of the n-channel transistor 414 are coupled together. The drain region of the n-channel transistor 414 is coupled to the drain region of the p-channel transistor 416. The source and base regions of the p-channel transistor 416 are coupled to the supply input value, while the gate region is coupled to an output p-channel transistor 418.

The bias circuitry in the output stage circuit 116 operates in a similar fashion as that in FIG. 2. In particular, the gate region of transistor 414 receives the bias output voltage created in FIG. 2 (i.e., output from transistors 214 and 216), and this voltage is converted into a current through transistor 414, which through current mirroring establishes a current in the parallel output amp 116.

The output stage 116 further includes an output amplifier comprising six p-channel transistors 408, 418, 420, 412, 422 and 424, four n-channel transistors 426, 428, 430, and 432 and an output capacitor 434. The source and base regions of the p-channel transistors 408, 418, 420, 412, and 422 are connected to the supply input. The drain region of the p-channel transistor 408 is connected to the source region of the p-channel transistor 424, while the base region of the p-channel transistor 408 is connected to the base region of the p-channel transistor 424. The gate region of p-channel transistor 424 is connected to the gate region of n-channel transistor 426. The gate region of the p-channel transistor 420 is connected to the drain region of the p-channel transistor 412 and the gate region of the p-channel transistor 422. The gate region of the p-channel transistor 412 is connected to the output through the capacitor 434, and the drain region of the p-channel transistor is connected directly to the output. The drain regions of the p-channel transistors 418 and 424 are connected to the drain region of the n-channel transistor 428, and the drain region of the n-channel transistor 426. The gate region of n-channel transistor 428 is connected to the gate region of n-channel transistor 430. The drain regions of p-channel transistor 420 and the n-channel transistor 430 are connected. The gate region of the n-channel transistor 432 is connected to the input stage output, and the drain region of the n-channel transistor 432 is connected to the output. Further, the base and source regions of the n-channel transistors 426, 428, 430, and 432 are all connected.

The output stage 116 operates in a similar fashion as the output stage 112 (illustrated in FIG. 2). For instance, the output stage 116 operates to either push a voltage on the output node down or pull a voltage on the output node up. The output of the output stage 116 is coupled with the output of the differential amp 102. This is made possible because both of these output stages are similar in terms of DC potentials, i.e., the DC voltage that is present at the output of the input stage in FIG. 2 is the same as the DC voltage present at the output of the input stage on FIG. 3, thus the inputs to the output stages 112 and 116 are the same and can be connected together. This is established through the interconnection of the bias circuitry throughout the op-amp 100.

Figure 5:
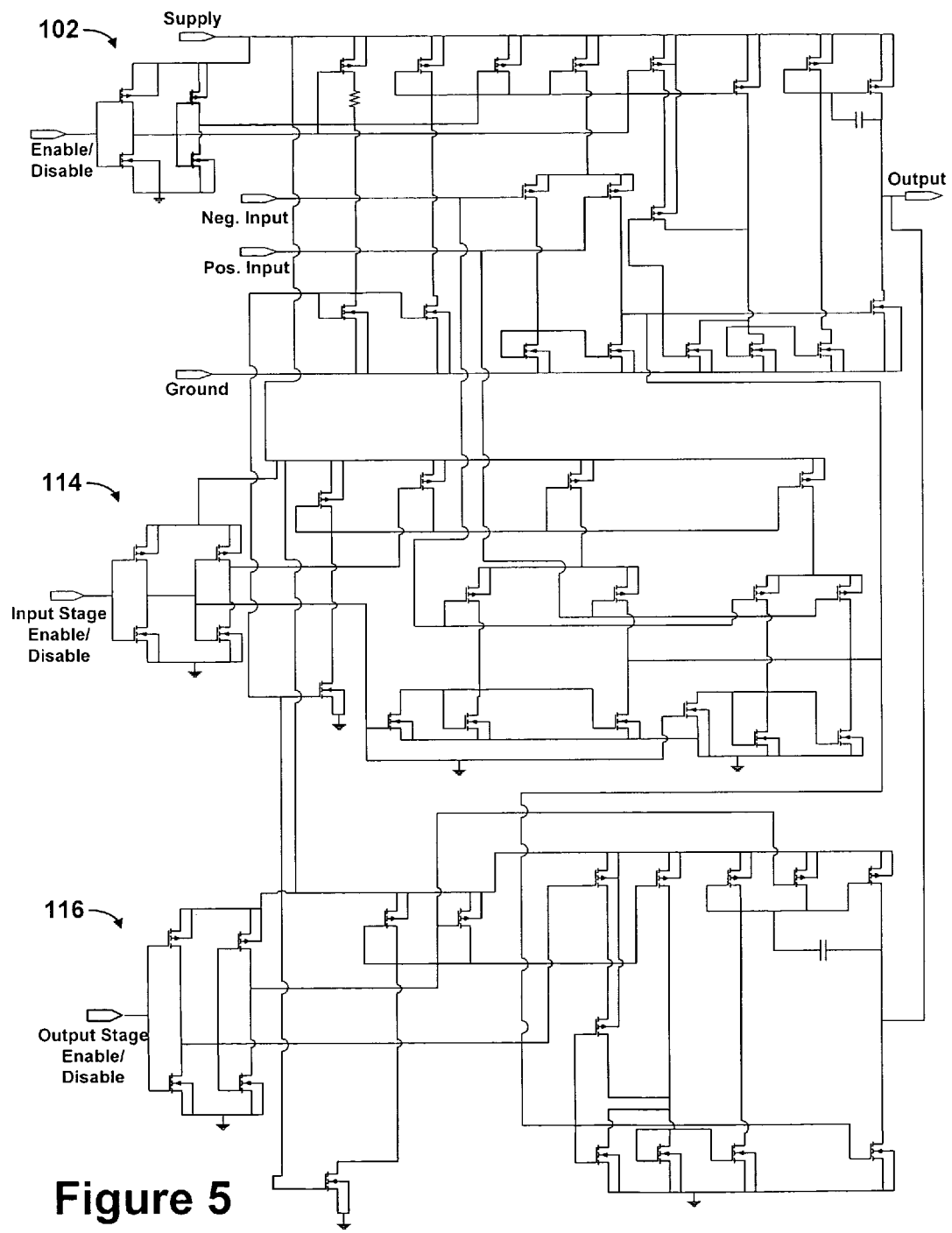
FIG. 5 is a schematic diagram illustrating one embodiment of the operational amplifier with selectable performance characteristics of FIG. 1.

FIG. 5 is a schematic diagram illustrating one embodiment of the operational amplifier with selectable performance characteristics of FIG. 1. The schematic in FIG. 5 illustrates the connections between the schematic diagrams of FIG. 2, FIG. 3 and FIG. 4. Each separate block 102, 114, and 116 has its own set of enable/disable transistors, which are used for the purpose of activating or deactivating each block, i.e. the differential amp 102, the parallel input stage 114, or the parallel output stage 116. Disabling the differential amp 102 turns the op-amp off. However, the differential amp 102 may operate even when disabling either of the input stage 114 and/or output stage 116. In addition, the op-amp will operate in a selectable mode when disabling either of the input stage 114 or output stage 116. For example, referring back to FIG. 1, if the output stage 116 is disabled, the output of the input stage 114 is coupled to the output stage 112 of the differential amp 102 to modify performance characteristics of the op-amp 100. Similarly, if the input stage 114 is disabled, the output stage 116 may still operate to modify performance characteristics of the op-amp 100.

As an example, a noise performance of the op-amp 100 is determined by the input stage 110, and in particular, by how much current is flowing through the input stage 110. By enabling a parallel input stage (e.g., selectable input stage circuitry 114), an area of the op-amp 110 and an amount of current flowing through the op-amp is increased, thus decreasing the amount of noise present.

As another example, an output drive capability of the op-amp 100 is effectively determined by the output stage 112. By enabling a parallel output stage (e.g., selectable output stage circuitry 116) additional current is dissipated within the op-amp's output stages (as compared to the amount of current dissipated just within the output stage 112), which enables a voltage output to more effectively be pulled up or pushed down. In turn, smaller value load resistances or larger value load resistances can be driven, and the linearity capability of the op-amp 100 may be improved.

As a further example, a bandwidth of the op-amp 100 is determined by a number of variables. By enabling the parallel input stage (e.g., selectable input stage circuitry 114), the bandwidth decreases, which is related to loading of the parallel input stage. Conversely, by enabling the parallel output stage (e.g., selectable output stage circuitry 116), more power is dissipated in the parallel input stage and thus the bandwidth increases.

Example performance characteristics for the op-amp 100 based on whether the selectable input stage 114 and/or selectable output stage 116 are enabled or disabled are detailed below in Table 1. The examples shown in Table 1 were simulated using the op-amp connected as a follower (i.e., the op-amp feedback was configured such that the amplifier gain was +1) with an input=2 Vpp@1 MHz, and an output-input error ≦50 mV. (When the "enable" function for each block is at 0V (e.g., in disable mode) the entire block is then in "sleep" mode and may consume about 10 seconds of nA in current).

TABLE 1

| Selectable Input Enabled? | Selectable Output Enabled? | Supply Current (mA) | Unity Gain Bandwidth (MHz) | Input-Ref. Noise nV/rt(Hz) | Min. Load (Ω) |
|---|---|---|---|---|---|
| No | No | 3.9 | 240 | 4.7 | 500 |
| No | Yes | 4.8 | 170 | 4.7 | 250 |
| Yes | No | 5.9 | 470 | 2.9 | 500 |
| Yes | Yes | 6.8 | 360 | 2.9 | 250 |

As seen from the examples in Table 1, for best noise performance, the supply current is the largest. Similarly, for a larger gain bandwidth, the supply current increases.

Further, as seen from Table 1, as more of the parallel circuitry is enabled, the supply current increases, and as different sets of parallel circuitry are enabled, the gain bandwidth changes. Also, by operating the parallel input stage (e.g., the bottom two states) a better input referred noise can be obtained. Further, by operating the parallel output stage, a small load resistance that can be driven with disable linearity performance can be obtained.

Using the input stage 114, output stage 116 and differential amp 102 in the example illustrated in FIG. 5, there are five possible states due to the arrangement of the disable circuitry, e.g., differential amp OFF or ON, input OFF-output OFF, input ON-output OFF, input OFF-output ON, and input ON-output ON. However, there may be any number of states depending on the amount of transistors used in the disable circuitry and on the amount of control pins available for the op-amp 100. Thus, even through only five operational modes are illustrated in the exemplary embodiment, there can be any number of operational modes based on the number of control pins on the op-amp 100.

The different states of the op-amp 100 may be characterized as different operational modes that provide different performance characteristics, e.g., different bandwidths or available load resistances. These modes can be seen as disabled, minimally enabled, intermediately enabled, and maximally enabled based on the amount of supply current within the op-amp 100, for example. The modes describe different modes during operation of the op-amp 100, in addition to the sleep mode for when the op-amp is not operating.

The exemplary embodiment may be used in many different types of systems that would benefit from the ability to select performance characteristics, and thus allowing an application to optimize power dissipation. As a specific example, the op-amp 100 may be used within battery-powered units with RF transceivers. In this instance, the transceiver is generally in a "sleep" mode; however, the receiver periodically becomes "awake" at minimal power to look for a strong signal that would instruct the receiver to become fully "awake." Thus, the receiver may then change to a higher power mode, exchange information, and return to the sleep mode.

As another example, a battery-powered RF transceiver should be able to communicate with "distant" transceivers and "close" transceivers. The transceiver may communicate with distant transceivers by optimizing noise performance through selection of the parallel input stage. Alternatively, the transceiver may communicate with close transceivers by optimizing the linearity through selection of the parallel output stage.

While exemplary embodiments have been described, persons of skill in the art will appreciate that variations may be made without departure from the scope and spirit of the invention. The true scope and spirit of the invention is defined by the appended claims, which may be interpreted in light of the foregoing.

What is claimed is:

1. A multi-mode operational amplifier comprising:
an amplifier arranged to amplify a difference between a first input and a second input so as to provide a differential output; and
mode selection circuitry coupled to the amplifier and arranged to provide an output signal to the differential output, wherein the output signal operates to control a number of different operational modes for the amplifier, and wherein the mode selection circuitry comprises selectable input stage circuitry arranged to be enabled or disabled by a first selectable signal so as to reflect an operational mode.

2. The multi-mode operational amplifier of claim 1, wherein the mode selection circuitry is coupled to the first input and the second input so as to provide the output signal to control a mode of the amplifier based on the first input and the second input.

3. The multi-mode operational amplifier of claim 1, wherein the mode selection circuitry is arranged to provide at least five different operational modes for the amplifier.

4. The multi-mode operational amplifier of claim 1, wherein the different operational modes include modes having different levels of performance characteristics of the amplifier.

5. The multi-mode operational amplifier of claim 1, wherein the different operational modes include modes selected from the group consisting of disabled, minimally enabled, intermediately enabled, and maximally enabled.

6. The multi-mode operational amplifier of claim 1, wherein the mode selection circuitry further comprises selectable output stage circuitry arranged to be enabled or disabled by a second selectable signal so as to reflect the operational mode.

7. The multi-mode operational amplifier of claim 6, wherein the different operational modes comprise modes selected from the group consisting of enabling both of the selectable input stage circuitry and the selectable output stage circuitry, enabling the selectable input stage circuitry and disabling the selectable output stage circuitry, disabling the selectable input stage circuitry and enabling the selectable output stage circuitry , and disabling both of the selectable input stage circuitry and the selectable output stage circuitry.

8. The multi-mode operational amplifier of claim 7, wherein when the selectable output stage circuitry is enabled, the amplifier is a linear amplifier.

9. The multi-mode operational amplifier of claim 7, wherein when the selectable input stage circuitry and the selectable output stage circuitry are both enabled, a supply current to the amplifier increases.

10. The multi-mode operational amplifier of claim 7, wherein when the selectable input stage circuitry is enabled, a unity gain bandwidth of the amplifier increases.

11. The multi-mode operational amplifier of claim 7, wherein when the selectable input stage circuitry is enabled, an input-referred noise value of the amplifier decreases.

12. The multi-mode operational amplifier of claim 7, wherein the selectable input stage circuitry comprises:
   a bias circuit to provide a reference;
   a first differential amplifier coupled to the reference; and
   a second differential amplifier arranged to provide a differential output based on the first input and the second input.

13. The multi-mode operational amplifier of claim 7, wherein the selectable input stage circuitry comprises:
   a bias circuit to provide a reference; and
   an output amplifier coupled to the reference and arranged to provide the output signal to the differential output.

14. A multi-mode operational amplifier comprising:
   a differential amplifier coupled to a pair of input terminals and arranged to provide an output signal on a differential amplifier output;
   a selectable input stage circuit coupled to the pair of input terminals and arranged to provide a second output signal on a second differential amplifier output; and
   a selectable output stage circuit coupled to the second differential amplifier output and based on whether one or both of the selectable input stage circuit and the selectable output stage circuit are enabled, the selectable input stage circuit or the selectable output stage circuit provides a control signal to the differential amplifier output, wherein the control signal operates to control a performance characteristic of the differential amplifier.

15. The multi-mode operational amplifier of claim 14, wherein the control signal controls performance characteristics of the differential amplifier selected from the group consisting of supply current, unity gain bandwidth, input-referred noise level, and a linearity of the differential amplifier.

16. The multi-mode operational amplifier of claim 14, wherein the differential amplifier includes:
   a bias circuit for creating a reference;
   an input stage for forming a difference signal between a negative and a positive input present on the pair of input terminals; and
   an output stage coupled to the reference and the difference signal and operable to either increase a voltage on the differential amplifier output or decrease a voltage on the differential amplifier output.

17. The multi-mode operational amplifier of claim 14, wherein the selectable input stage circuit comprises:
   a bias circuit for creating a reference; and
   an input stage differential amplifier coupled to the pair of input terminals and arranged to form a difference signal between signals on the pair of input terminals and to provide the difference signal to the differential amplifier and the selectable output stage circuit.

18. The multi-mode operational amplifier of claim 17, wherein the selectable output stage circuit comprises:
   a bias circuit for creating a reference; and
   an output amplifier coupled to the reference and the difference signal and operable to either push a voltage on the differential amplifier output down or pull a voltage on the differential amplifier output up.

19. The multi-mode operational amplifier of claim 14, wherein the differential amplifier includes enable circuitry that performs as a switch to either fully enable or disable the differential amplifier.

20. The multi-mode operational amplifier of claim 14, wherein the selectable input stage circuit includes enable circuitry that performs as a switch to either fully enable or disable the selectable input stage circuit.

21. The multi-mode operational amplifier of claim 14, wherein the selectable output stage circuit includes enable circuitry that performs as a switch to either fully enable or disable the selectable output stage circuit.

22. An operational amplifier comprising:
   a bias circuit arranged to provide a reference;
   an input stage including a differential amplifier, wherein the input stage is coupled to a pair of input terminals and is arranged to create a difference signal between signals on the pair of input terminals;
   an output stage coupled to the reference, to the difference signal, and to a differential amplifier output and is arranged to provide an output signal on the differential amplifier output;
   a parallel input stage coupled to the reference and arranged to provide a second output signal on a second differential amplifier output; and
   a parallel output stage coupled to the second differential amplifier output and arranged to output a control signal to the differential amplifier output.

23. The operational amplifier of claim 22, wherein the parallel input stage and the parallel output stage include enable circuitry arranged to enable or disable operation of the parallel input stage and the parallel output stage.

24. The operational amplifier of claim 23, wherein the parallel input stage provides the second output signal on the second differential amplifier output based on whether the parallel input stage is enabled.

25. The operational amplifier of claim 23, wherein the parallel output stage outputs the control signal to the differential amplifier output based on whether the parallel output stage is enabled.

26. The operational amplifier of claim 22, wherein the control signal controls performance characteristics of the operational amplifier.

27. The operational amplifier of claim 22, wherein the second output signal controls operational modes for the operational amplifier.

28. The operational amplifier of claim 22, wherein the control signal controls operational modes for the operational amplifier.

* * * * *

UNITED STATES PATENT AND TRADEMARK OFFICE
CERTIFICATE OF CORRECTION

PATENT NO. : 7,030,690 B2  Page 1 of 1
APPLICATION NO. : 10/777323
DATED : April 18, 2006
INVENTOR(S) : Mark D. Dvorak It is certified that error appears in the above-identified patent and that said Letters Patent is hereby corrected as shown below:

Title Page item 73, Assignee, please delete "Minneapolis, MN", replace with -- Morristown, NJ --.

Signed and Sealed this

Fourth Day of November, 2008

JON W. DUDAS
*Director of the United States Patent and Trademark Office*